United States Patent
Adiga et al.

(10) Patent No.: US 11,004,896 B1
(45) Date of Patent: May 11, 2021

(54) SYSTEM AND METHOD FOR NON-INVASIVE LARGE-SCALE QUBIT DEVICE CHARACTERIZATION TECHNIQUE

(71) Applicant: INTERNATIONAL BUSINESS MACHINES CORPORATION, Armonk, NY (US)

(72) Inventors: Vivekananda P. Adiga, Ossining, NY (US); Martin O. Sandberg, Ossining, NY (US); Hanhee Paik, Danbury, CT (US); Jerry M. Chow, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/676,304

(22) Filed: Nov. 6, 2019

(51) Int. Cl.
*H01L 27/18* (2006.01)
*B82Y 10/00* (2011.01)
(Continued)

(52) U.S. Cl.
CPC .............. *H01L 27/18* (2013.01); *G06N 10/00* (2019.01); *H01L 39/025* (2013.01);
(Continued)

(58) Field of Classification Search
CPC ..... H01L 27/18; H01L 39/025; H01L 39/221; B82Y 10/00; B82Y 30/00; G06N 10/00
(Continued)

(56) References Cited

U.S. PATENT DOCUMENTS

| 7,002,174 B2 | 2/2006 | Il'ichev et al. |
| 7,321,884 B2 | 1/2008 | Burkard et al. |
| (Continued) | | |

FOREIGN PATENT DOCUMENTS

| CN | 103987051 B | 5/2017 |
| CN | 106372725 B | 4/2019 |
| JP | 201158852 A | 3/2011 |

OTHER PUBLICATIONS

Shanks et al., "A scanning transmon qubit for strong coupling circuit quantum electrodynamics", Nature Communications, vol. 4, No. 1991, Jun. 7, 2013, pp. 1-6.
(Continued)

*Primary Examiner* — Tu-Tu V Ho
(74) *Attorney, Agent, or Firm* — Henry J. Daley; Venable LLP

(57) ABSTRACT

According to an embodiment of the present invention, a system for non-invasively characterizing a qubit device includes a characterization probe chip. The characterization probe chip includes a substrate and a characterization resonator formed on a first surface of the substrate. The characterization resonator includes a superconducting stripline, and a superconducting antenna coupled to an end of the superconducting stripline, the superconducting antenna positioned to align with a qubit on the qubit device being characterized. The characterization probe chip also includes and a superconducting ground plane formed on a second surface of the substrate, the second surface opposing the first surface. In operation, the superconducting antenna is configured to capacitively couple the characterization resonator to the qubit aligned with the superconducting antenna for characterization of the qubit.

20 Claims, 16 Drawing Sheets

(51) Int. Cl.
  *G06N 10/00* (2019.01)
  *H01L 39/02* (2006.01)
  *H01L 39/22* (2006.01)
  *B82Y 30/00* (2011.01)

(52) U.S. Cl.
  CPC ............ *H01L 39/221* (2013.01); *B82Y 10/00* (2013.01); *B82Y 30/00* (2013.01)

(58) Field of Classification Search
  USPC .......................................................... 257/30
  See application file for complete search history.

(56) References Cited

U.S. PATENT DOCUMENTS

| | | |
|---|---|---|
| 7,418,283 B2 | 8/2008 | Amin |
| 8,089,286 B2 | 1/2012 | Silva et al. |
| 10,282,675 B2 | 5/2019 | Bloom et al. |
| 10,565,515 B2 * | 2/2020 | Lampert ........... H01L 29/66439 |

OTHER PUBLICATIONS

De Graaf et al., "A near-field scanning microwave microscope based on a superconducting resonator for low power measurements", Review of Scientific Instruments, 84.2, (2013): 023706.
Blais et al., "Cavity quantum electrodynamics for superconducting electrical circuits: An architecture for quantum computation", Physical Review A, vol. 69 (2004), pp. 062320-1-062320-14.

* cited by examiner

SYSTEM AND METHOD FOR NON-INVASIVE LARGE-SCALE QUBIT DEVICE CHARACTERIZATION TECHNIQUE

BACKGROUND

The currently claimed embodiments of the present invention relate to systems and methods for qubit device characterization, and more specifically, to non-invasive, large scale qubit device characterization.

Today's fixed frequency quantum processors rely on very precise control of the frequencies of the processor's qubits. The uncertainty in qubit frequency is primarily a consequence of uncertainty in the Josephson junction fabrication, and the resulting critical current. Currently, even modestly small quantum processors of tens of qubits have only a very small statistical chance to be frequency collision free.

To increase the likelihood of obtaining a fully functional quantum processor, the qubits have to be individually screened. Today that screening relies on direct measurements of the Josephson junction resistance. The resistance can then be related back to the critical current of the junction. However, the relationship between the resistance and the critical current can be obscured by leakage currents in substrates, etc. Accordingly, in order to accurately characterize the qubits, the qubits first have to be screened, and then actually measured in a cryostat, fully package, to find the exact relationship for each processor chip. Characterization systems are needed that provide flexibility to and enhance the efficiency of the characterization process.

SUMMARY

According to an embodiment of the present invention, a system for non-invasively characterizing a qubit device includes a characterization probe chip. The characterization probe chip includes a substrate and a characterization resonator formed on a first surface of the substrate. The characterization resonator includes a superconducting stripline, and a superconducting antenna coupled to an end of the superconducting stripline, the superconducting antenna positioned to align with a qubit on the qubit device being characterized. The characterization probe chip also includes a superconducting ground plane formed on a second surface of the substrate, the second surface opposing the first surface. In operation, the superconducting antenna is configured to capacitively couple the characterization resonator to the qubit aligned with the superconducting antenna for characterization of the qubit.

According to an embodiment of the present invention, a system for non-invasively characterizing a qubit device includes a characterization probe chip. The characterization probe chip includes a substrate, and a characterization resonator formed on a first surface of the substrate. The characterization resonator includes a superconducting centerline, and a pair of opposing superconducting ground planes formed on the first surface of the substrate. The pair of opposing superconducting ground planes are formed on opposing sides of the superconducting centerline. The characterization resonator also includes a superconducting antenna coupled to an end of the superconducting centerline, the superconducting antenna positioned to align with a qubit on the qubit device being characterized. In operation, the superconducting antenna is configured to capacitively couple the characterization resonator to the qubit aligned with the superconducting antenna for characterization of the qubit. In operation, the superconducting centerline and the pair of opposing superconducting ground planes form a coplanar waveguide resonator.

According to an embodiment of the present invention, a method of non-invasively characterizing a qubit device includes bringing a characterization probe chip into proximity with the qubit device, the characterization probe chip having a characterization resonator comprising a superconducting stripline and a superconducting antenna coupled to an end of the superconducting stripline. The method includes positioning the characterization probe chip such that the superconducting antenna aligns with a qubit on the qubit device being characterized. The method includes capacitively coupling the characterization resonator to the qubit using the superconducting antenna, and characterizing the qubit using the capacitively coupled characterization resonator.

DETAILED DESCRIPTION

Figure 1:
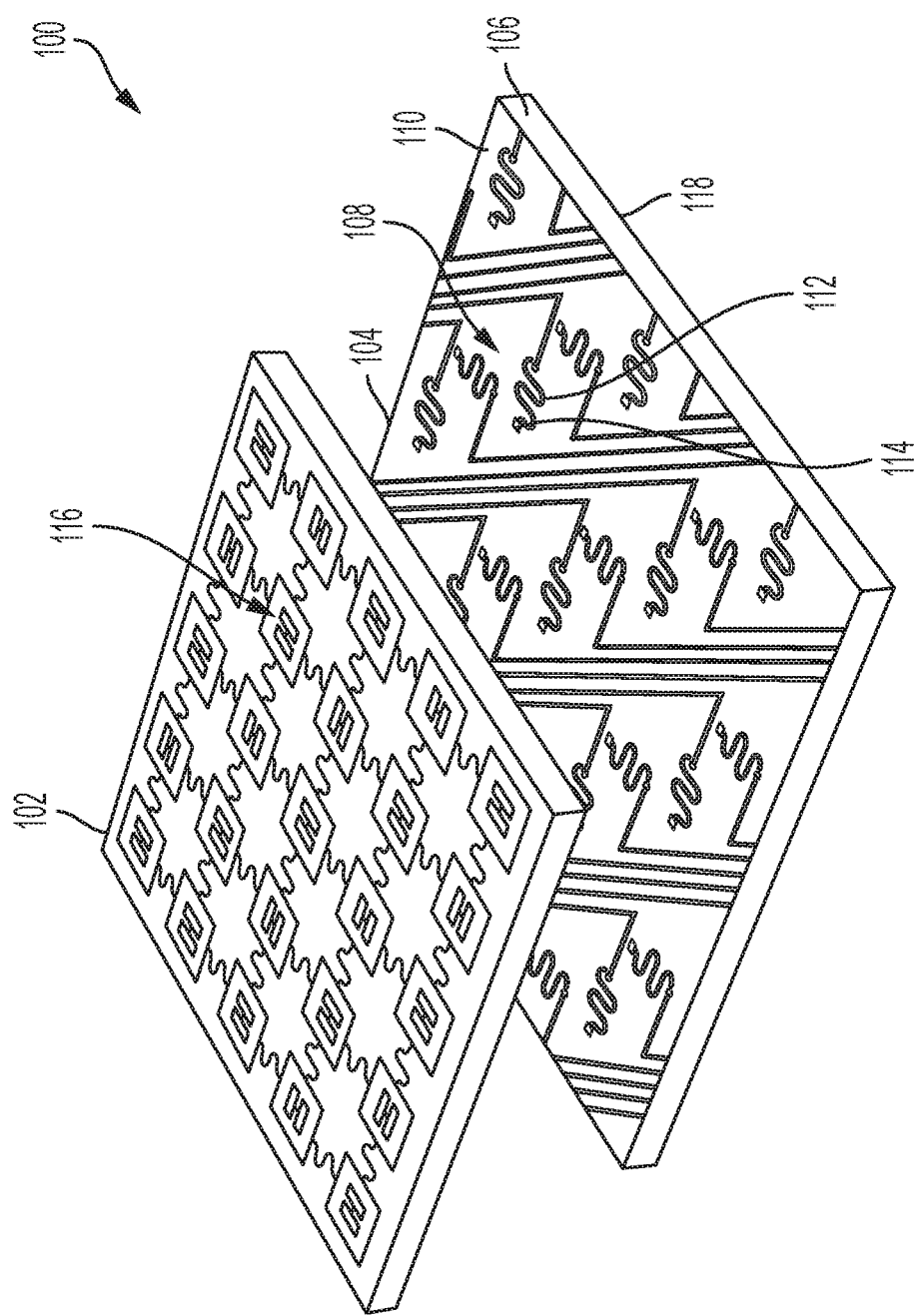
FIG. 1 is a schematic illustration of a system for non-invasively characterizing a qubit device according to some embodiments of the present invention.

FIG. 1 is a schematic illustration of a system 100 for non-invasively characterizing a qubit device 102 according to some embodiments of the present invention. The system 100 includes a characterization probe chip 104. The characterization probe chip 104 includes a substrate 106, and a characterization resonator 108 formed on a first surface 110 of the substrate 106. The characterization resonator 108 includes a superconducting stripline 112, and a superconducting antenna 114 coupled to an end of the superconducting stripline 112. The superconducting antenna 114 is positioned to align with a qubit 116 on the qubit device 102 being characterized. The characterization probe chip 104 also includes a superconducting ground plane 118 formed on a second surface of the substrate 106, the second surface opposing the first surface 110. In operation, the superconducting antenna 114 is configured to capacitively couple the characterization resonator 108 to the qubit 116 aligned with the superconducting antenna 114 for characterization of the qubit 116.

Figure 2:
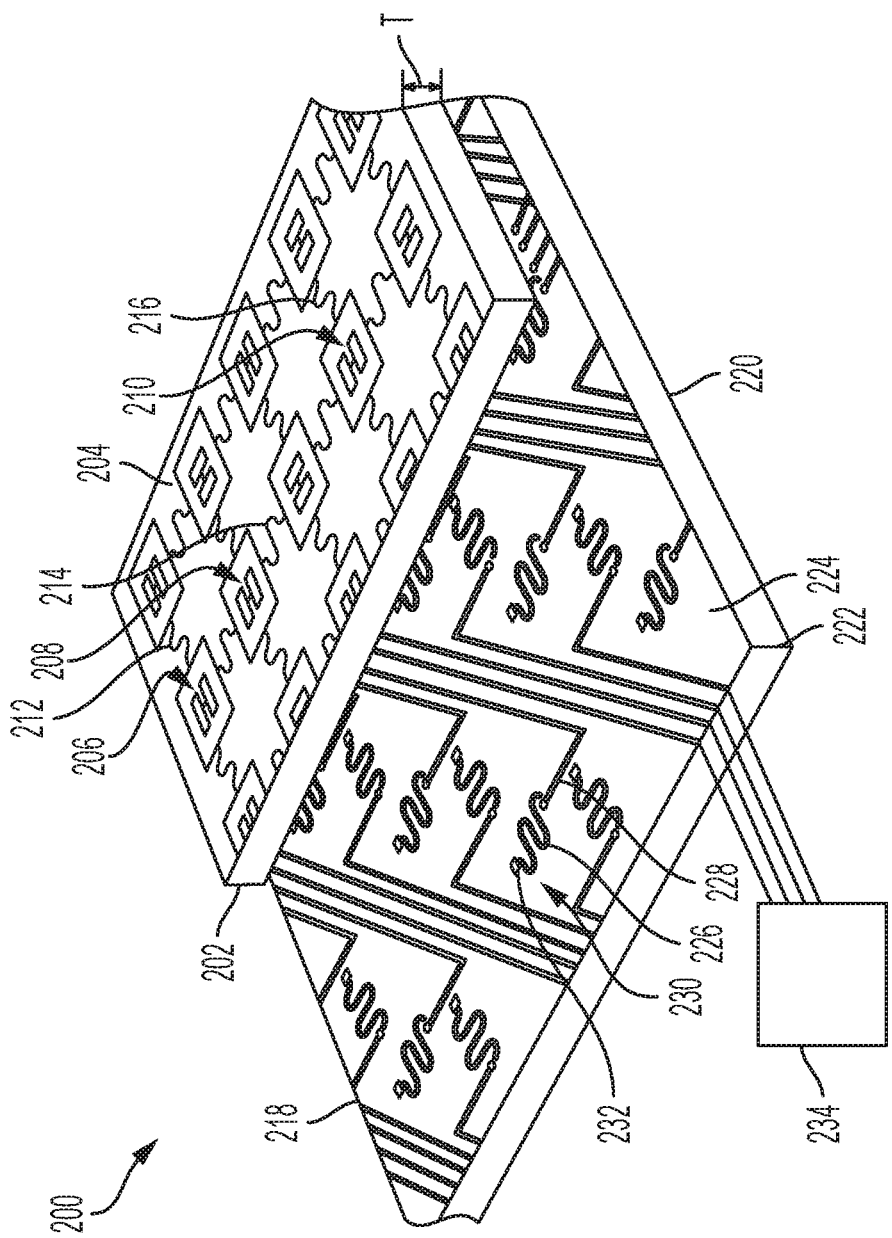
FIG. 2 is a schematic illustration of a qubit device and a system for non-invasively characterizing the qubit device according to some embodiments of the present invention.

FIG. 2 is a schematic illustration of a qubit device 202 and a system 200 for non-invasively characterizing the qubit device 202 according to some embodiments of the present invention. The qubit device 202 includes a superconducting ground plane 204. The superconducting ground plane 204 covers most of the surface of the qubit device 202, apart from one or more regions where qubits 206, 208, 210 are formed, and one or more bus resonators 212, 214, 216 used to control and couple the qubits 206, 208, 210. In FIG. 2, a portion of the qubit device 202 is not illustrated so that more of the characterization probe chip 218 is visible. The qubits 206, 208, 210 schematically illustrated in FIG. 2 are transmon qubits, which have large capacitor pads that can easily couple to an external antenna. However, the embodiments of the invention are not limited to transmon qubits. The system 200 may be used to characterize a qubit device 202 having any type of qubit. According to some embodiments, the quantum device 202 is a quantum processor.

As described above, the characterization probe chip 218 according to some embodiments includes a superconducting ground plane 220 formed on a second surface of the substrate 222, the second surface opposing the first surface 224. In operation, the superconducting ground plane 220 formed on the second surface of the characterization probe chip 218, the superconducting stripline 226 formed on the first surface 224 of the characterization probe chip 218, and the superconducting ground plane 204 formed on the qubit device 202 form a stripline resonator. The substrate 222 may be, for example, a dielectric material, a material used for a qubit processor substrate, or some other low loss substrate. The substrate 222 may be, for example, a silicon substrate or an FR-4 board.

According to some embodiments of the invention, the system 200 further includes a control circuit 228 configured to generate a characterization signal in the characterization resonator 230. The control circuit 228 is further configured to detect a resonance signal of the characterization resonator 230 when the characterization signal is on resonance with the qubit (not shown in FIG. 2) with which the antenna 232 is aligned.

According to some embodiments of the invention, the system 200 further includes a processor 234 in communication with the control circuit 228. The processor 234 is configured to receive an indication of the detected resonance signal from the control circuit 228, and calculate a frequency of the qubit aligned with the superconducting antenna 232 based on the detected resonance signal. As shown in FIG. 2, the characterization probe chip 218 may include a plurality of a characterization resonators. Each characterization resonator may have a corresponding control circuit, and the processor may be in communication with each control circuit. Thus, the characterization probe chip 218 may be enable each of the qubits on a qubit device to be probed without requiring repositioning of the qubit device 202 and characterization probe chip 218, thereby enhancing the efficiency of the characterization process.

As described above, the qubit device 202 includes a first surface on which the qubit is formed, and a second surface opposing the first surface. According to some embodiments of the present invention, the characterization probe chip 218 is configured to be releasably fixed with respect to the qubit device 202 such that the first surface 224 of the substrate 222 of the characterization probe chip 218 faces the second surface (for example, the backside) of the qubit device 202. This orientation of the qubit device 202 and characterization probe chip 218 is shown in FIGS. 1 and 2. In operation, the superconducting antenna 232 is configured to capacitively couple the characterization resonator 230 to the qubit through the bulk of the qubit device 202. The term "bulk" refers to the thickness T of the qubit device 202 from the first surface on which the qubit is formed to the opposing surface.

Figure 3:
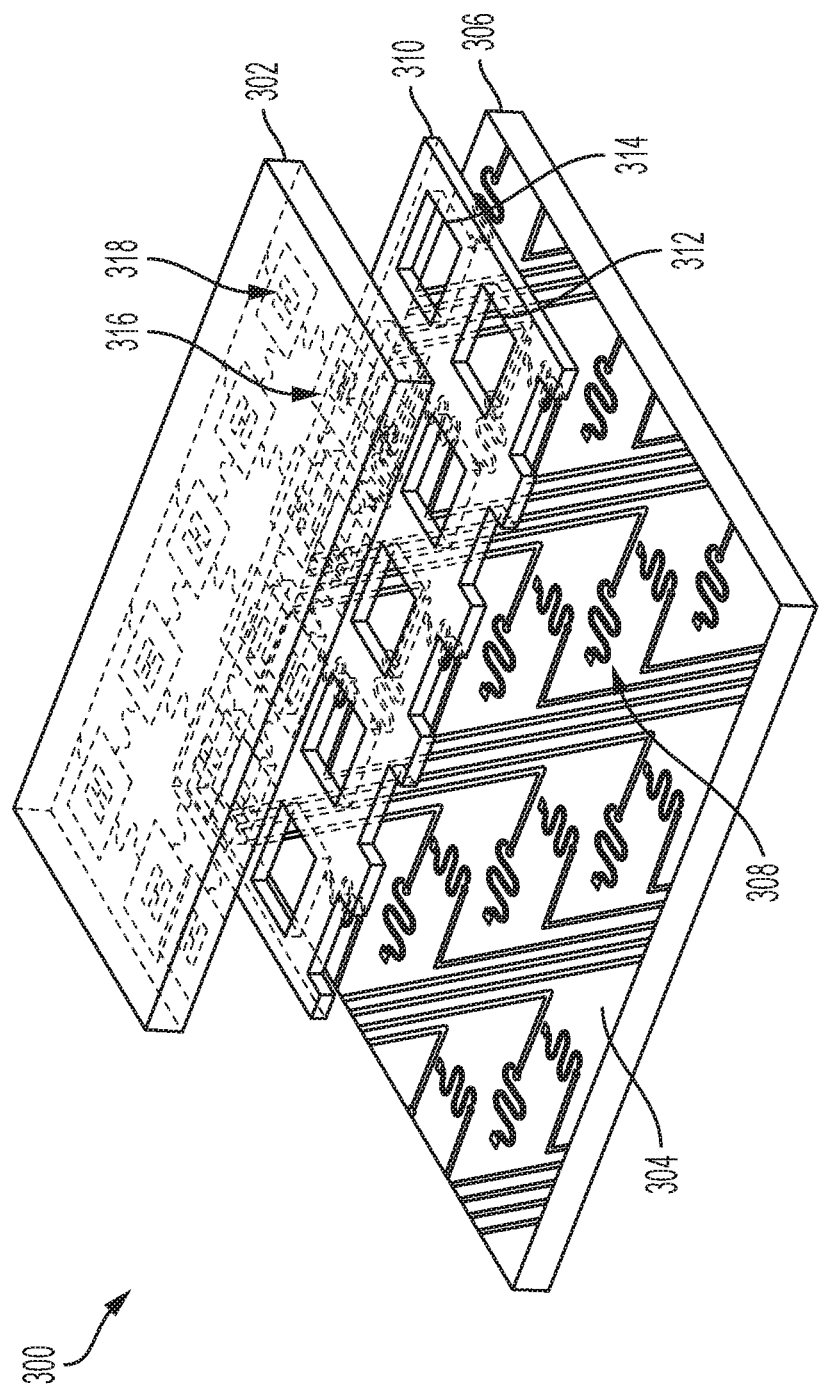
FIG. 3 is a schematic illustration of an alternative configuration of the system for non-invasively characterizing the qubit device.

FIG. 3 is a schematic illustration of an alternative configuration of the system 300 for non-invasively characterizing the qubit device 302. In this configuration, the first surface 304 of the characterization probe chip 306 is configured to face the surface of qubit device 302 with the qubits formed thereon. In FIG. 3, the first surface 304 of the characterization probe chip 306 faces up, while the surface of qubit device 302 with the qubits formed thereon faces down. In order to prevent the characterization resonator 308 from contacting one of the qubits on the qubit device 302 or the ground plane on the qubit device 302, an interposer chip 310 may be disposed between the qubit device 302 and the characterization probe chip 306. As shown in FIG. 3, the interposer chip 310 may define a plurality of windows 312, 314 corresponding to positions of qubits 316, 318 on the qubit device 302, enabling the antennas aligned with the qubits 316, 318 to couple with the qubits. In FIG. 3, a portion of the qubit device 302 and the interposer chip 310 is not illustrated so that the characterization probe chip 306 is visible.

Figure 4:
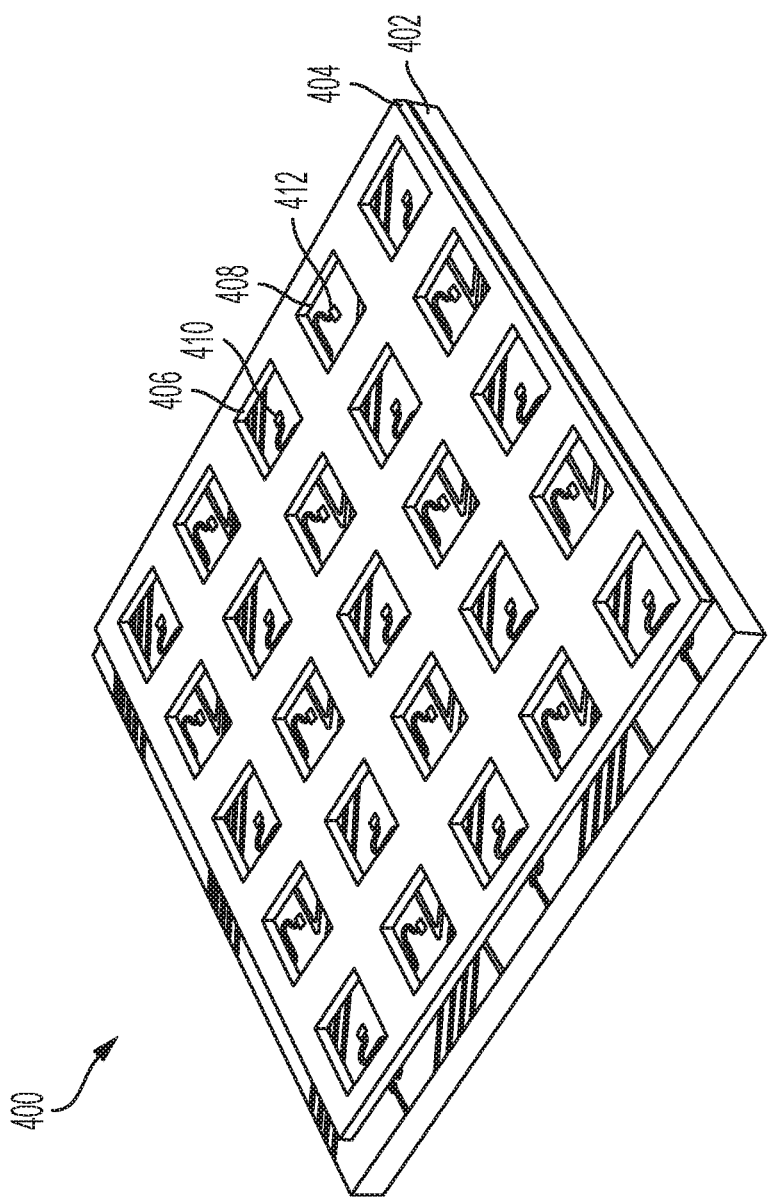
FIG. 4 is a schematic illustration of a system for non-invasively characterizing a qubit device according to some embodiments of the present invention.

FIG. 4 is a schematic illustration of a system 400 for non-invasively characterizing a qubit device according to some embodiments of the present invention. FIG. 4 illustrates a characterization probe chip 402 and an interposer chip 404. The interposer chip 404 defines a plurality of windows 406, 408. The position of the windows 406, 408 corresponds to the position of the antennas 410, 412, enabling the antennas 410, 412 to couple to correspondingly positioned qubits on the qubit device.

Figure 5:
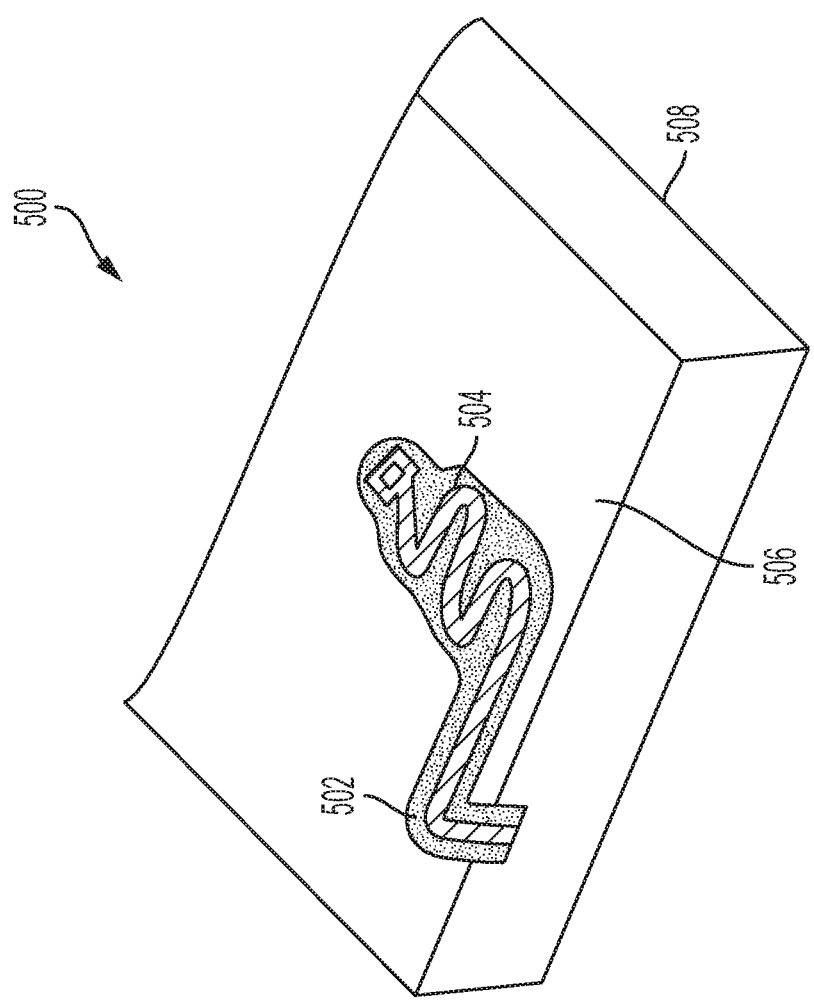
FIG. 5 is a schematic illustration of a characterization probe chip that includes a trench according to some embodiments of the present invention.

As described above, the characterization probe chip according to some embodiments is configured to be releasably fixed with respect to the qubit device such that the surface of the characterization probe chip on which the characterization resonator is formed faces the surface of the qubit device on which the qubit is formed. In this configuration, an interposer chip may be disposed between the characterization probe chip and the qubit device, as illustrated in FIG. 3. Alternatively, the surface of the substrate of the characterization probe chip may include a trench formed therein, and the characterization resonator may be formed in the trench. FIG. 5 is a schematic illustration of a characterization probe chip 500 that includes a trench 502 according to some embodiments of the present invention. The characterization resonator 504 is formed in the trench 502. This configuration enables the first surface 506 of the characterization probe chip 500 to directly contact the surface of the qubit device on which the qubit is formed while still preventing the characterization resonator from directly contacting the qubit or other electrically conducting features formed on the surface of the qubit device. The second surface 508 opposing the first surface is a first superconducting ground plane. The surface of the qubit device on which the qubit is formed provides a second superconducting ground plane. The first superconducting ground plane, the stripline of the characterization resonator 504, and the second superconducting ground plane form an asymmetric stripline resonator.

Figure 6:
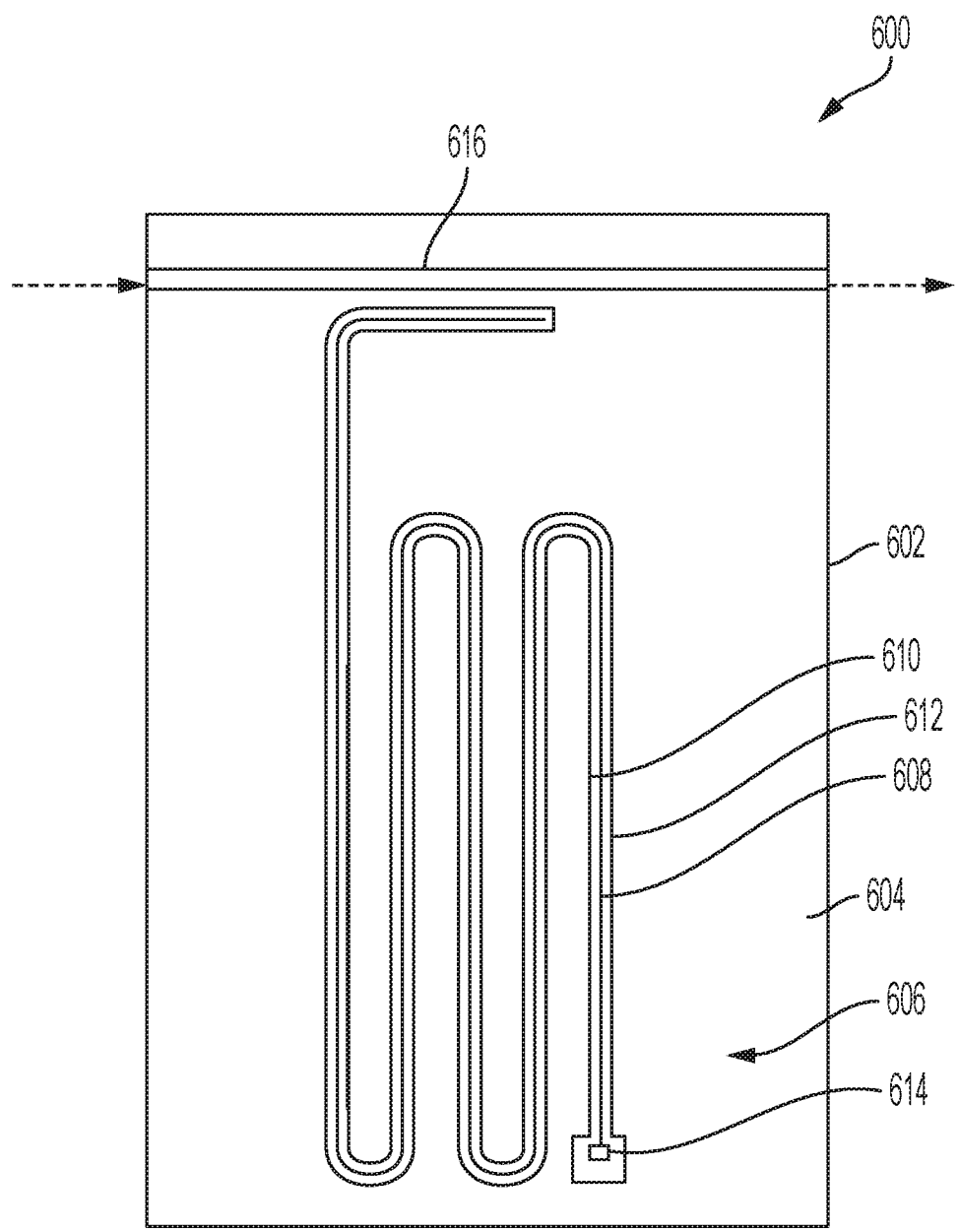
FIG. 6 is a schematic illustration of a system for non-invasively characterizing a qubit device according to some embodiments of the present invention.

FIG. 6 is a schematic illustration of a system 600 for non-invasively characterizing a qubit device according to some embodiments of the present invention. The system 600 includes a characterization probe chip 602. The characterization probe chip 602 includes a substrate 604, and a characterization resonator 606 formed on a first surface of the substrate 604. The characterization resonator 606 includes a superconducting centerline 608 and a pair of opposing superconducting ground planes 610, 612 formed on the first surface of the substrate 604. The pair of opposing superconducting ground planes 610, 612 are formed on opposing sides of the superconducting centerline 608. The characterization resonator 606 also includes a superconducting antenna 614 coupled to an end of the superconducting centerline 608. The superconducting antenna 614 is positioned to align with a qubit on the qubit device being characterized. In operation, the superconducting antenna 614 is configured to capacitively couple the characterization resonator 606 to the qubit aligned with the superconducting antenna 614 for characterization of the qubit. Further, in operation, the superconducting centerline 608 and the pair of opposing superconducting ground planes 610, 612 form a coplanar waveguide resonator.

According to some embodiments of the invention, the system 600 further includes a control circuit configured to generate a characterization signal in the characterization resonator 606. For example, the control circuit may include a feedline 616 coupled to the characterization resonator 606. The control circuit may be configured to detect a resonance signal of the characterization resonator 606 when the characterization signal is on resonance with the qubit. The system 600 may include a processor in communication with the control circuit, as schematically illustrated in FIG. 2. The processor may be configured to receive an indication of the detected resonance signal from the control circuit, and calculate a frequency of the qubit aligned with the superconducting antenna 614 based on the detected resonance signal. The electric field at the far end of the coplanar waveguide resonator interacts with the qubit, thus allowing for frequency and energy relaxation probing.

Figure 7:
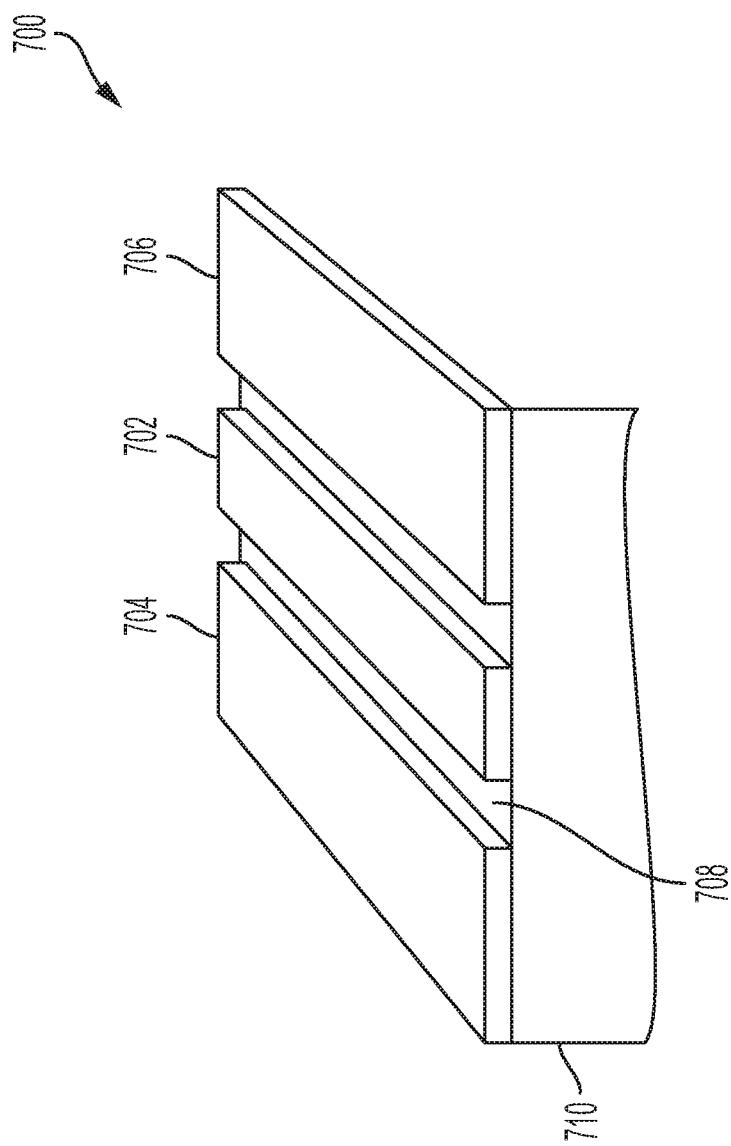
FIG. 7 is a schematic illustration of a portion of a characterization resonator.

FIG. 7 is a schematic illustration of a portion of a characterization resonator 700. The characterization resonator 700 includes a superconducting centerline 702 and a pair of opposing superconducting ground planes 704, 706 formed on a first surface 708 of a substrate 710. As illustrated in FIG. 7, the pair of opposing superconducting ground planes 704, 706 are formed on opposing sides of the superconducting centerline 702. The superconducting centerline 702 and the pair of opposing superconducting ground planes 704, 706 form a coplanar waveguide resonator.

Figure 8:
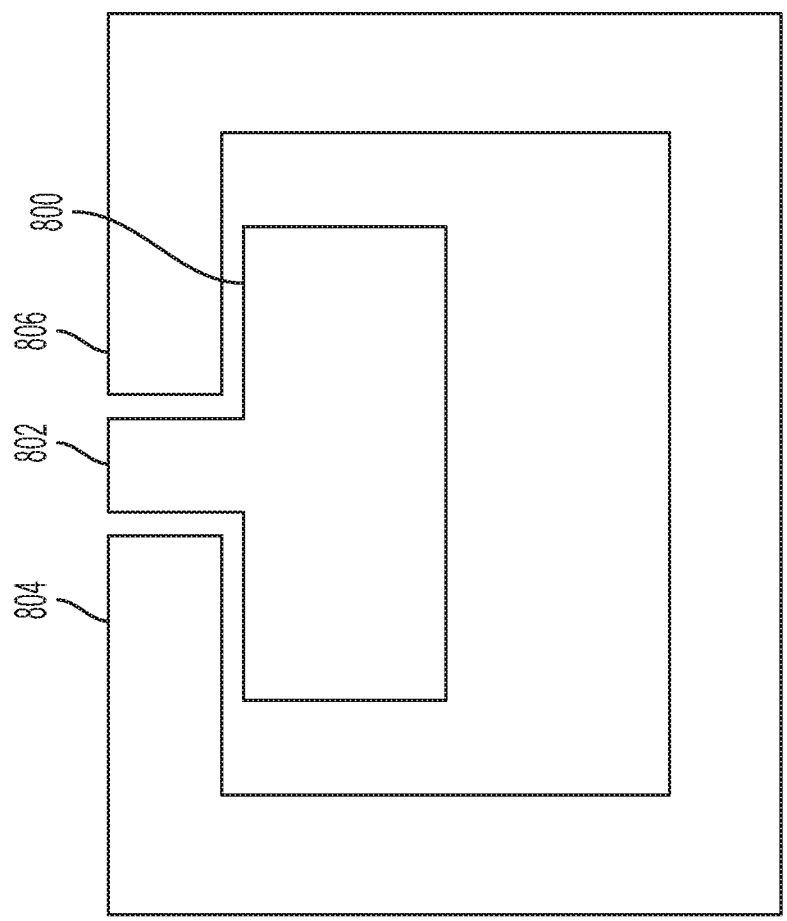
FIG. 8 is a schematic illustration of a superconducting antenna according to some embodiments of the present invention.

FIG. 8 is a schematic illustration of a superconducting antenna 800 according to some embodiments of the present invention. A portion 802 of the antenna 800 connects to the centerline of the coplanar waveguide resonator, and portions 804, 806 connect to the pair of opposing superconducting ground planes, as illustrated in FIG. 6. The antenna may have a shape other than that illustrated in FIG. 8, which is provided as an example. The shape of the antenna may depend on the shape and geometry of the qubit. For example, the shape of the antenna may depend on the shape of the capacitor pads if the qubit is a transmon qubit.

The characterization probe chip 602 illustrated in FIG. 6 includes a single characterization resonator 606. However, embodiments of the invention are not limited to a characterization probe chip having a single characterization resonator. The characterization probe chip may include a plurality of characterization resonators, like the characterization probe chips schematically illustrated in FIGS. 1-4. Further, the characterization probe chip 602 may be configured to be releasably fixed with respect to the qubit device such that the first surface of the substrate faces the first surface of the qubit device, as schematically illustrated in FIG. 3, or such that the first surface of the substrate faces the second surface of the qubit device, as schematically illustrated in FIGS. 1 and 2. The characterization probe chip 602 may be similar to the characterization probe chips schematically illustrated in FIGS. 1-4, but with the characterization resonators in FIGS. 1-4 replaced by characterization resonators that include a coplanar waveguide resonator.

Figure 9:
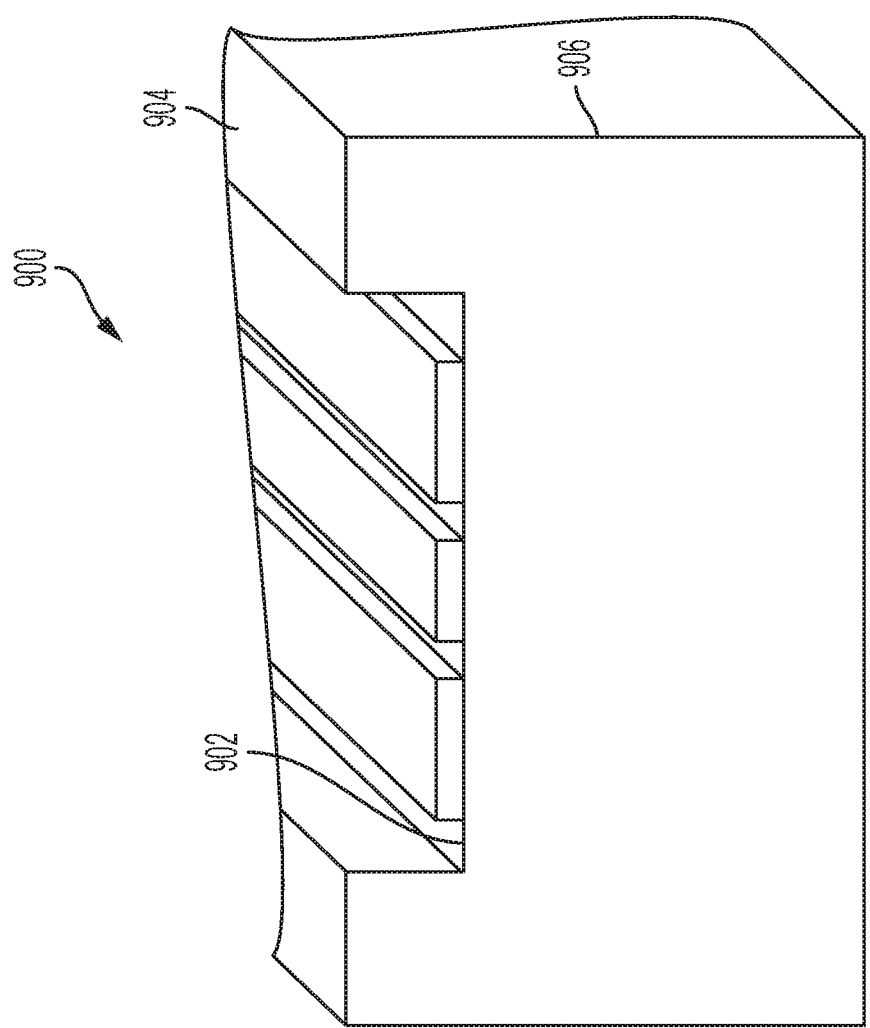
FIG. 9 is a schematic illustration of a portion of a characterization resonator formed in a trench.

According to some embodiments of the invention, the first surface of the substrate comprises a trench formed therein, and the characterization resonator is formed in the trench. FIG. 9 is a schematic illustration of a portion of a characterization resonator 900 formed in a trench 902. The trench 902 is formed in the first surface 904 of the substrate 906. The trench 902 enables the characterization probe chip to be releasably fixed with respect to the qubit device such that the first surface 904 of the substrate 906 faces the first surface of the qubit device, without the characterization resonator 900 contacting the qubit device. Alternatively, an interposer chip may be disposed between the qubit device and the characterization probe chip, as schematically illustrated in FIG. 3.

According to some embodiments of the present invention, a system for non-invasively characterizing a qubit device includes a characterization probe chip. The characterization probe chip includes a substrate, and a superconducting transmission line with an antenna formed on a first surface of the substrate. The superconducting antenna is positioned to align with a qubit on the qubit device being characterized. In operation, the superconducting antenna is configured to capacitively couple the superconducting transmission line to the qubit aligned with the superconducting antenna for characterization of the qubit. The characterization probe chip can be used from the top side, for example, with a superconducting 0 ring at the edges, or from the bottom side.

Figure 10:
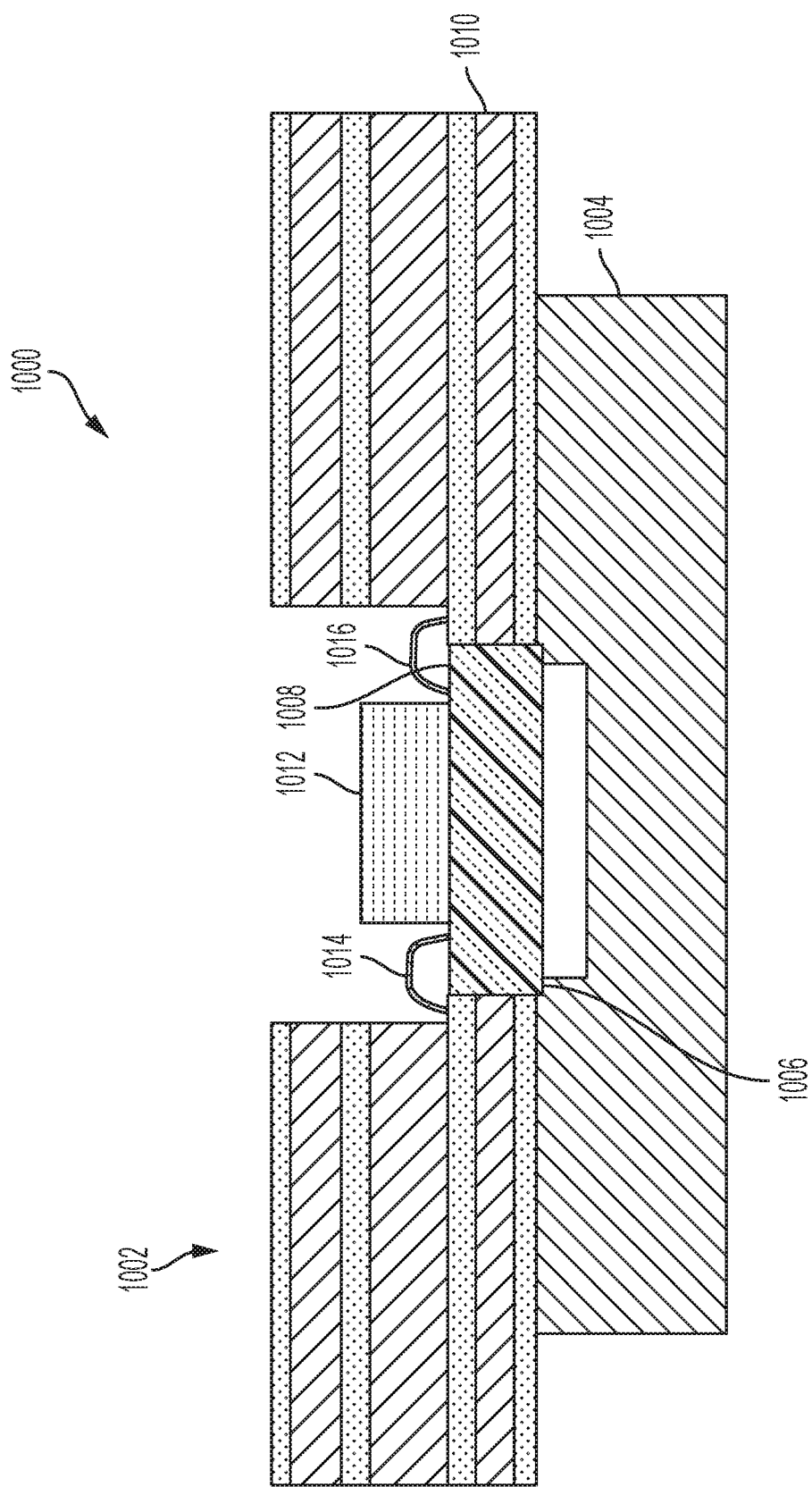
FIG. 10 is a schematic illustration of a system including an enclosure.

According to an embodiment of the present invention, the system includes an enclosure configured to mount the characterization probe chip and the qubit device. FIG. 10 is a schematic illustration of a system 1000 including an enclosure 1002. The enclosure 1002 includes a base substrate 1004 defining a compartment 1006 configured to receive the characterization probe chip 1008. The base substrate 1004 may include, for example, copper. The enclosure 1002 also includes a printed circuit board 1010 mechanically coupled to the base substrate 1004. The printed circuit board 1010 further defines the compartment 1006. The enclosure 1002 also includes temporary fixtures 1014, 1016 configured to releasably fix a position of the characterization probe chip 1008 with respect to the qubit device 1012 during the characterization of the qubit. The ground planes of the qubit device 1012 and the characterization probe chip 1008 may be connected to a common ground for forming a stripline resonator. The qubit device 1012 and characterization probe chip 1008 may be cooled to low temperatures, for example, about 100 mK, for characterization of one or more qubits on the qubit device 1012. For characterization, a spectroscopy signal may be applied through a microwave resonator. If the signal is resonant with the qubit and the characterization resonator is sufficiently nearby, a response will be detected.

Figure 11:
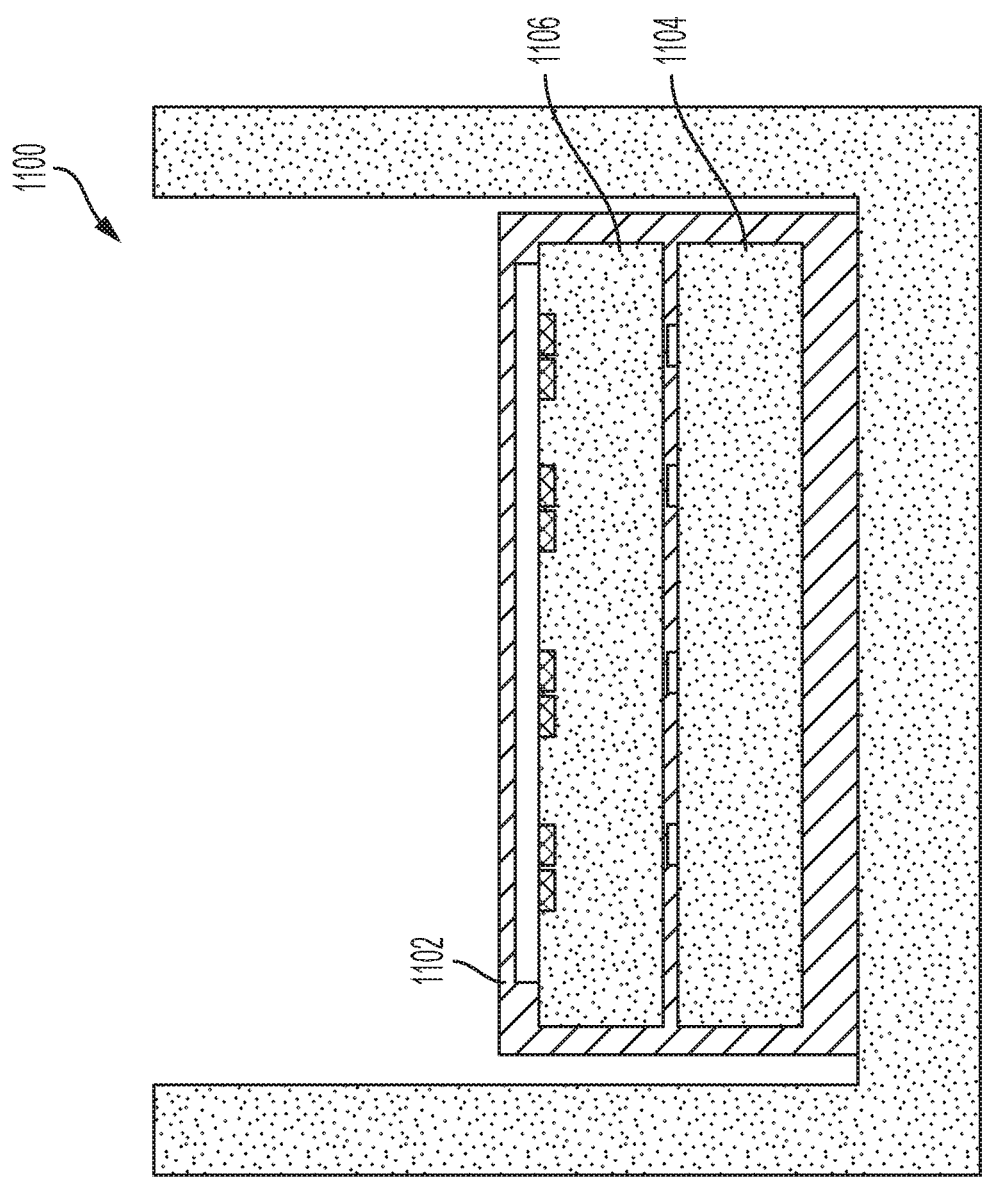
FIG. 11 shows a fast turnaround system according to some embodiments of the present invention.

FIG. 11 shows a fast turnaround system (i.e., a physical property measurement system (PPMS)) 1100 according to some embodiments of the present invention. The fast turnaround system 1100 includes a refrigeration fixture 1102 configured to hold a characterization probe chip 1104 and a qubit device 1106. For example, the refrigeration fixture may be a 100 mK fixture. The fast turnaround system 1100 may be used to quickly characterize qubit devices, such as qubit chips. The qubit chips can be probed prior to bump bonding (for example, for frequency allocation) or after bump bonding in the case of backside coupling. The fast turnaround system 1100 is compact, and does not require that the qubit device 1106 be lowered to base temperature to measure the frequencies of the qubits located on the qubit device 1106.

Figure 12:
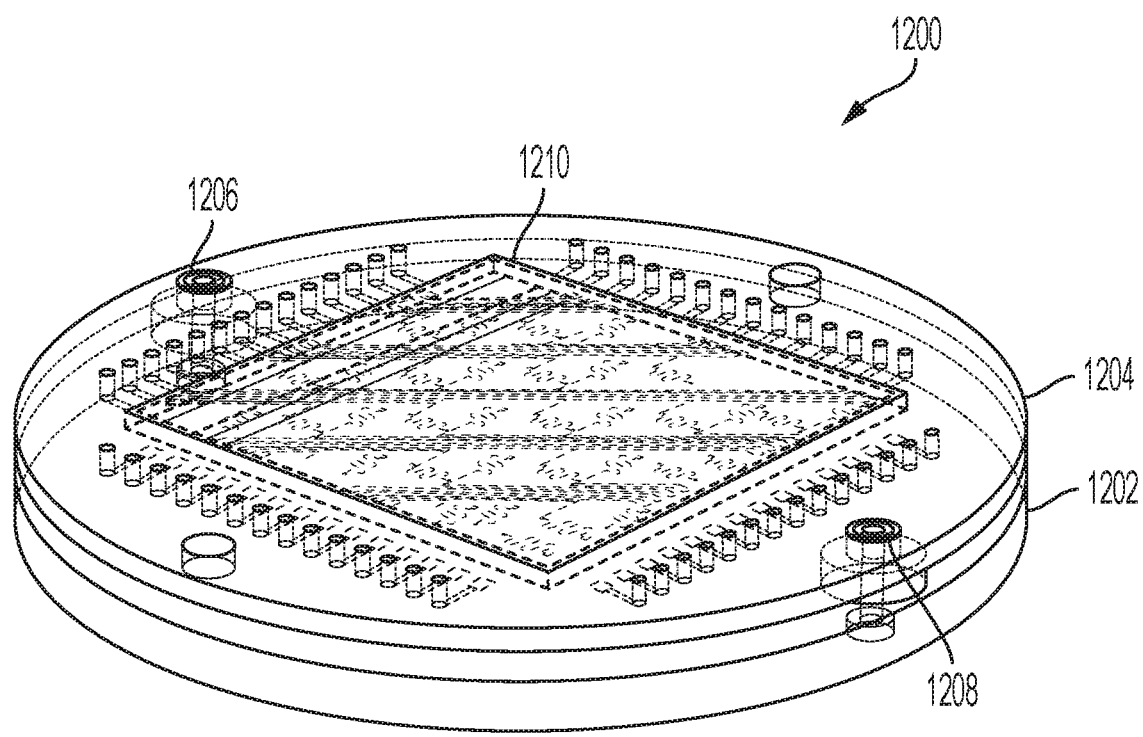
FIG. 12 is a schematic illustration of a system for non-invasively characterizing a qubit device according to some embodiments of the invention.

FIG. 12 is a schematic illustration of a system 1200 for non-invasively characterizing a qubit device according to some embodiments of the invention. The system 1200 includes an enclosure that includes a base substrate 1202 and a printed circuit board 1204. The base substrate defines a first compartment configured to receive the qubit device therein. The printed circuit board 1204 is mechanically coupled to the base substrate 1202, for example, using fixtures 1206, 1208. The printed circuit board 1204 defines a second compartment configured to receive the characterization probe chip 1210 therein. The base substrate 1202 and the printed circuit board 1204 are configured to fix a position of the qubit device with respect to the characterization probe chip 1210 during characterization of the qubit device.

Figure 13:
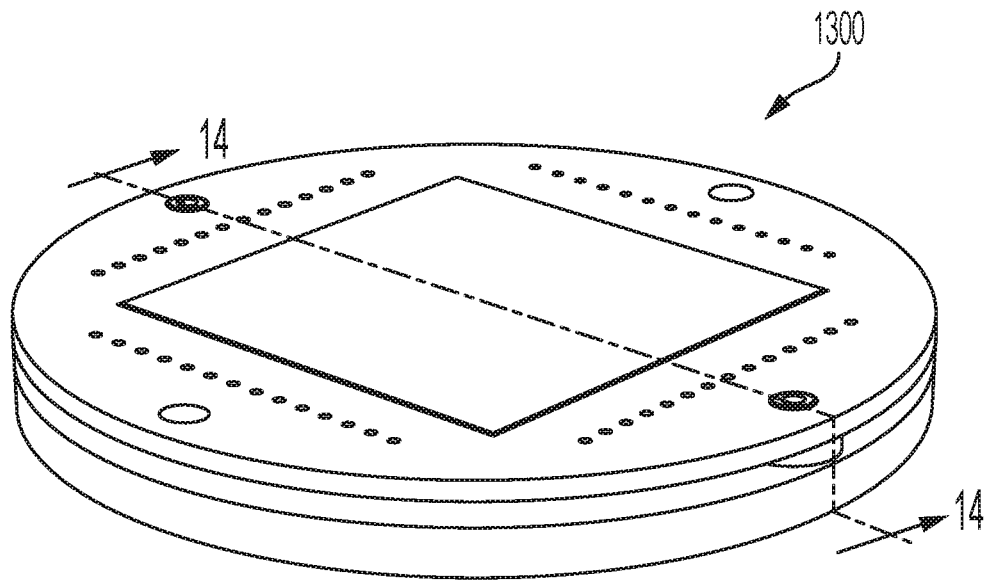
FIG. 13 is a schematic illustration of an outer surface of a system for non-invasively characterizing a qubit device according to some embodiments of the invention.
Figure 14:
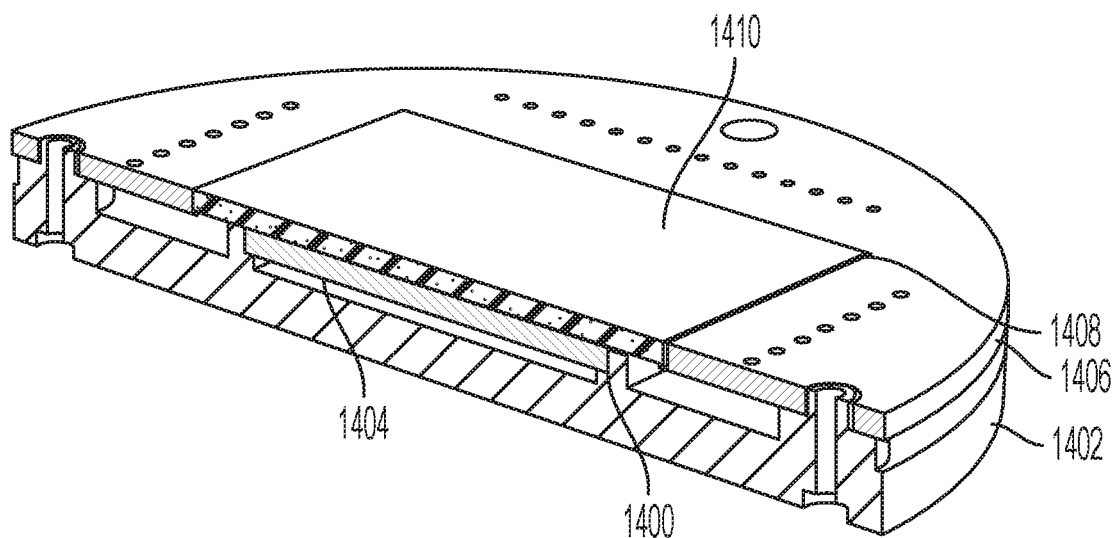
FIG. 14 is a schematic illustration of a first compartment defined by a base substrate and configured to receive a qubit device therein.

FIG. 13 is a schematic illustration of an outer surface of a system 1300 for non-invasively characterizing a qubit device according to some embodiments of the invention. FIG. 14 is a perspective cross-sectional view of the system 1300 shown in FIG. 13. FIG. 14 illustrates the first compartment 1400 defined by base substrate 1402 and configured to receive the qubit device 1404 therein. The printed circuit board 1406 defines a second compartment 1408 configured to receive the characterization probe chip 1410 therein. The first compartment 1400 defined by base substrate 1402 and the second compartment 1408 defined by the printed circuit board 1406 fix the position of the qubit device 1404 and the characterization probe chip 1410 during characterization of the qubit device 1404. Once the qubit device 1404 has been characterized, the characterization probe chip 1410 and the qubit device 1404 can be removed from the second compartment 1408 and the first compartment 1400, respectively, and the qubit device 1404 can be incorporated into a quantum system, for example, a quantum computational system.

Figure 15:
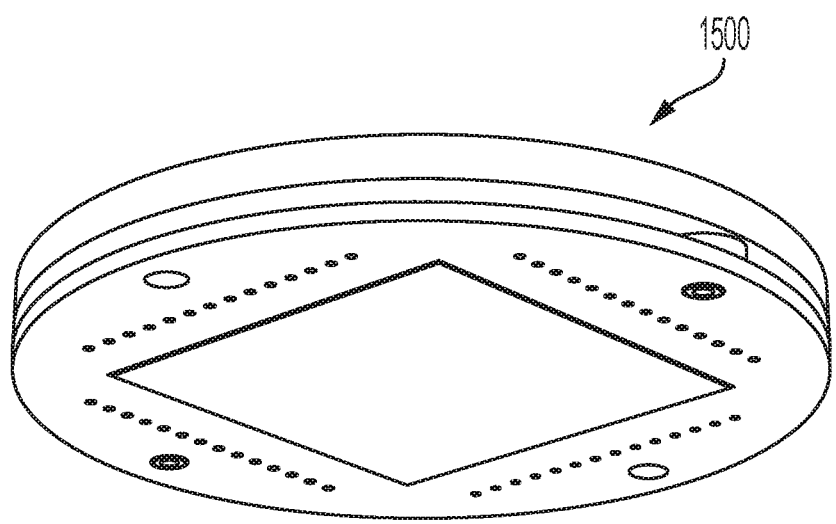
FIG. 15 is a schematic illustration of a system for non-invasively characterizing a qubit device according to some embodiments of the invention.
Figure 16:
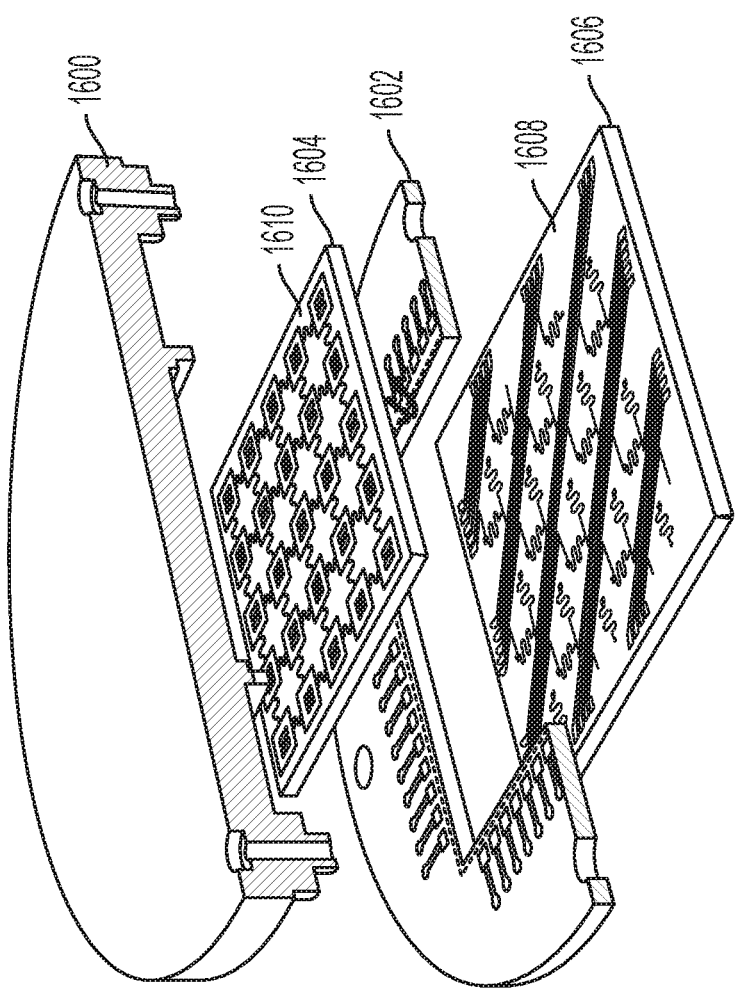
FIG. 16 illustrates a cross-sectional perspective view of the base substrate and the printed circuit board, and a perspective view of the qubit device and the characterization probe chip.

FIG. 15 is a schematic illustration of a system 1500 for non-invasively characterizing a qubit device according to some embodiments of the invention. The system 1500 is illustrated in an inverted orientation as compared to FIG. 12-14. FIG. 16 is an exploded partial view of the system 1500 in FIG. 15. FIG. 16 illustrates a cross-sectional perspective view of the base substrate 1600 and the printed circuit board 1602, and a perspective view of the qubit device 1604 and the characterization probe chip 1606. In the embodiment illustrated in FIG. 16, the first surface 1608 of the characterization probe chip 1606 faces the second surface of the qubit device 1604, the second surface opposing the first surface 1610. However, the first surface 1608 of the characterization probe chip 1606 may instead face the first surface 1610 of the qubit device 1604. The characterization resonators formed on the characterization probe chip 1606 may be any type of characterization resonator described herein.

Figure 17:
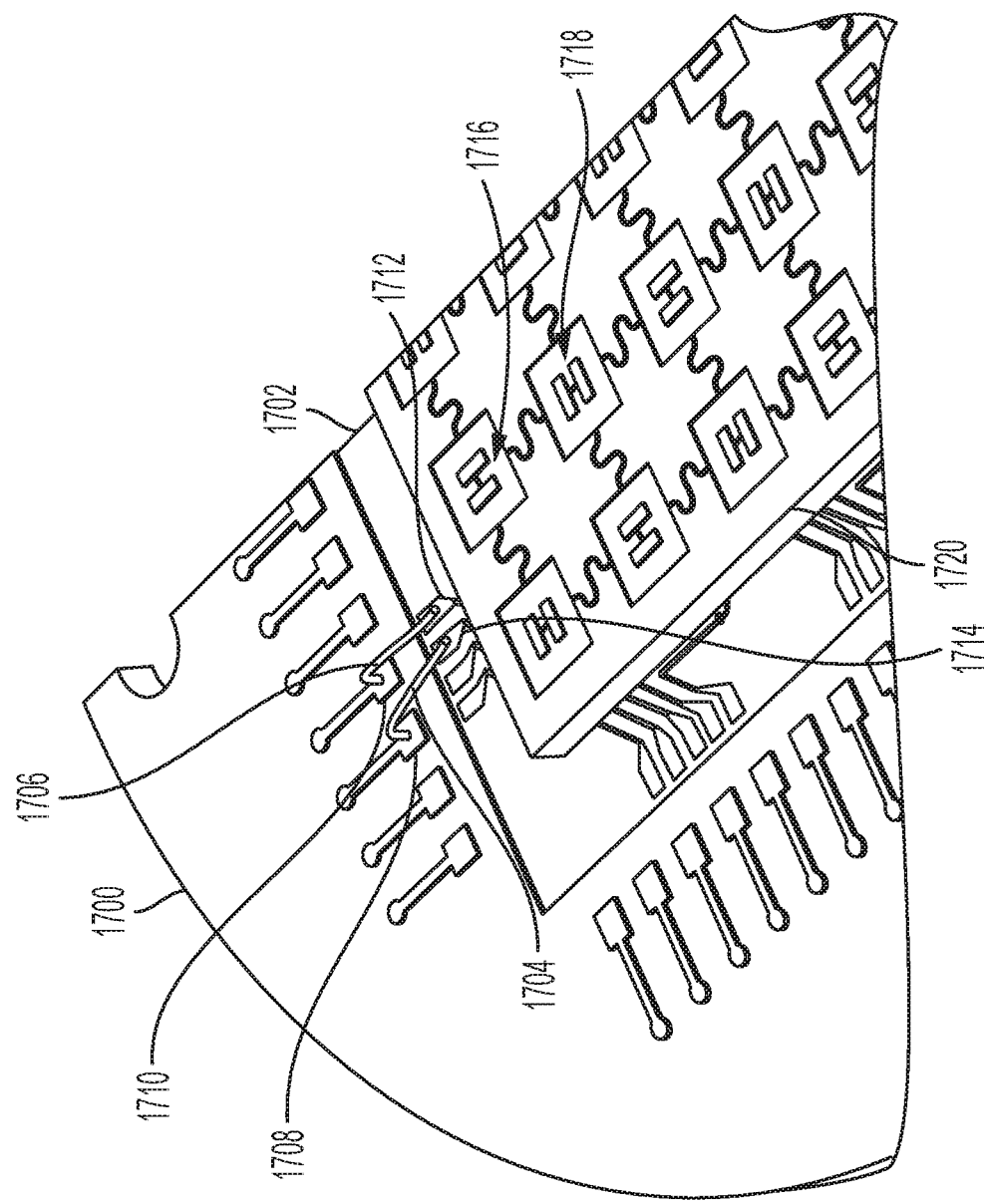
FIG. 17 is a schematic illustration of a printed circuit board coupled to a characterization probe chip according to some embodiments of the present invention.

FIG. 17 is a schematic illustration of a printed circuit board 1700 coupled to a characterization probe chip 1702 according to some embodiments of the present invention. The characterization probe chip 1702 is disposed in the compartment formed by the printed circuit board 1700. Leads 1704, 1706 connect pads 1708, 1710 on the printed circuit board 1700 to pads 1712, 1714 on the characterization probe chip 1702. The leads 1704, 1706 connect the control circuitry on the characterization probe chip 1702 to control circuitry on the printed circuit board 1700, enabling generation of a characterization signal in the characterization resonator, and allowing the control circuit to communicate with a processor for characterization of the qubits 1716, 1718 on the qubit device 1720.

Figure 18:
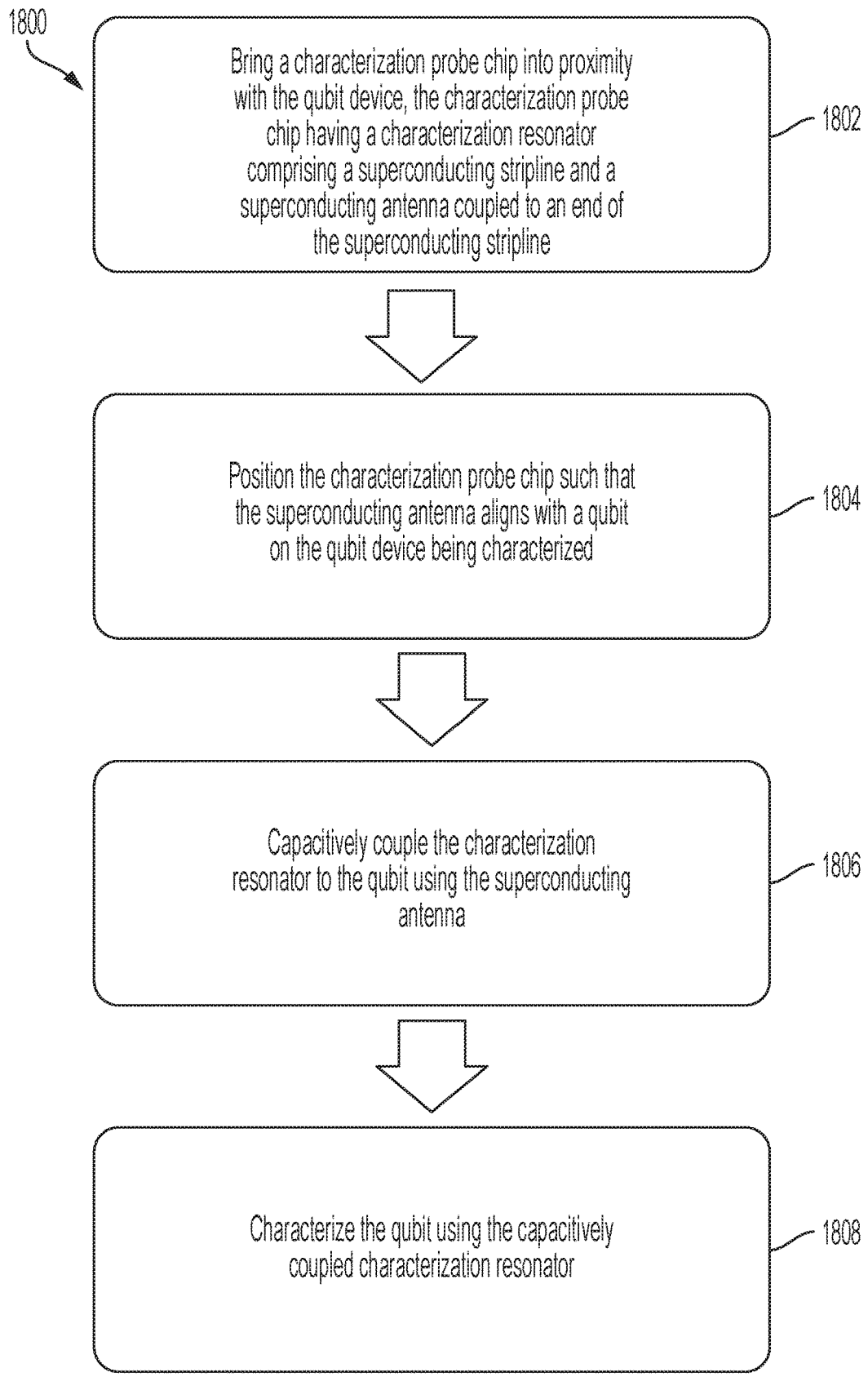
FIG. 18 is a flowchart that illustrates a method of non-invasively characterizing a qubit device according to some embodiments of the present invention.

FIG. 18 is a flowchart that illustrates a method 1800 of non-invasively characterizing a qubit device according to some embodiments of the present invention. The method 1800 includes bringing a characterization probe chip into proximity with the qubit device, the characterization probe chip having a characterization resonator comprising a superconducting stripline and a superconducting antenna coupled to an end of the superconducting stripline 1802. The method 1800 includes positioning the characterization probe chip such that the superconducting antenna aligns with a qubit on the qubit device being characterized 1804. The method 1800 includes capacitively coupling the characterization resonator to the qubit using the superconducting antenna 1806, and characterizing the qubit using the capacitively coupled characterization resonator 1810.

According to some embodiments of the present invention, the qubit device comprises a first surface on which the qubit is formed, and a second surface opposing the first surface, and bringing the characterization probe chip into proximity with the qubit device includes temporarily fixing the qubit device with respect to the characterization probe chip such that a surface of the characterization probe chip on which the characterization resonator is formed faces the first surface of the qubit device.

A method is described herein for obtaining qubit frequencies in a quantum processor prior to and/or after packaging. The method is a non-invasive method for obtaining qubit frequencies, and potentially energy relaxation times, of quantum processors. The method may be implemented on a full wafer scale, as well as on individual processor chips. The method may be implemented in a fast turnaround system for significant speedup of the frequency extraction.

The method for obtaining the qubit frequencies according to some embodiments employs a scanning chip that includes a stripline resonator.

According to an embodiments of the present invention, a probe chip includes superconducting stripline resonators with antennas at the end. The superconducting stripline resonators with antennas are patterned on the frontside of a wafer/substrate. These antennas are aligned to individual qubit locations. The backside of the wafer is a superconducting ground. The chip is brought proximal to or even into contact with the qubit processor from the backside or frontside and held with a fixture which acts like superconducting ground. The whole assembly acts like a stripline resonator. Due to the capacitance between the stripline resonator's antenna and the qubit, a state dependent frequency shift of the resonator can be detected and used to extract the qubit parameters, such as a qubit frequency and qubit energy relaxation time.

According to some embodiments of the present invention, a method for obtaining qubit frequencies includes providing a scanning chip including a stripline resonator. The scanning chip may be a probe chip with superconducting stripline resonators with antennas at the end patterned on the frontside of the wafer and aligned to individual qubit locations, wherein the backside of the wafer is a superconducting ground. The method includes bringing the chip into contact with the qubit processor from the backside or frontside and securing it with a fixture which acts like superconducting ground. This whole assembly acts like stripline resonator. Due to the capacitance between the stripline resonator's antenna and the qubit, a state dependent frequency shift of the resonator can be detected and used to extract the qubit parameters, such a qubit frequency and qubit energy relaxation time.

The method is well suited for flip chipped quantum processors. Full qubit characterization of flip chipped quantum processors is not otherwise possible until the full package is assembled. The method does not depend on the internal readouts of the chip. The method allows for frequency adjustments of individual qubits.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A system for non-invasively characterizing a qubit device, comprising:
   a characterization probe chip, comprising:
      a substrate;
      a characterization resonator formed on a first surface of the substrate, the characterization resonator comprising:
         a superconducting stripline; and
         a superconducting antenna coupled to an end of the superconducting stripline, the superconducting antenna positioned to align with a qubit on the qubit device being characterized; and
      a superconducting ground plane formed on a second surface of the substrate, the second surface opposing the first surface,
      wherein, in operation, the superconducting antenna is configured to capacitively couple the characterization resonator to the qubit aligned with the superconducting antenna for characterization of the qubit.

2. The system for non-invasively characterizing a qubit device according to claim 1, wherein the qubit device comprises a second superconducting ground plane, and
   wherein, in operation, the first-mentioned superconducting ground plane, the superconducting stripline, and the second superconducting ground plane form a stripline resonator.

3. The system for non-invasively characterizing a qubit device according to claim 1, further comprising:
   a control circuit configured to generate a characterization signal in the characterization resonator,
   wherein the control circuit is further configured to detect a resonance signal of the characterization resonator when the characterization signal is on resonance with the qubit.

4. The system for non-invasively characterizing a qubit device according to claim 3, further comprising a processor in communication with the control circuit,
   wherein the processor is configured to:
      receive an indication of the detected resonance signal from the control circuit, and
      calculate a frequency of the qubit aligned with the superconducting antenna based on the detected resonance signal.

5. The system for non-invasively characterizing a qubit device according to claim 1, wherein the qubit device comprises a first surface on which the qubit is formed, and a second surface opposing the first surface, and
   wherein the characterization probe chip is configured to be releasably fixed with respect to the qubit device such that the first surface of the substrate faces the first surface of the qubit device.

6. The system for non-invasively characterizing a qubit device according to claim 5, wherein the first surface of the substrate comprises a trench formed therein, and
   wherein the characterization resonator is formed in the trench.

7. The system for non-invasively characterizing a qubit device according to claim 5, further comprising an interposer chip, wherein the interposer chip is configured to be disposed between the qubit device and the characterization probe chip.

8. The system for non-invasively characterizing a qubit device according to claim 1, wherein the qubit device comprises a first surface on which the qubit is formed, and a second surface opposing the first surface, and
   wherein the characterization probe chip is configured to be releasably fixed with respect to the qubit device such that the first surface of the substrate faces the second surface of the qubit device, and
   wherein, in operation, the superconducting antenna is configured to capacitively couple the characterization resonator to the qubit through a bulk of the qubit device.

9. The system for non-invasively characterizing a qubit device according to claim 1, further comprising a temporary fixture configured to releasably fix a position of said characterization probe chip with respect to said qubit device during the characterization of the qubit.

10. The system for non-invasively characterizing a qubit device according to claim 1, further comprising:
   an enclosure configured to mount the characterization probe chip and the qubit device, comprising:
      a base substrate defining a first compartment configured to receive the qubit device therein; and
      a printed circuit board mechanically coupled to the base substrate, the printed circuit board defining a second compartment configured to receive the characterization probe chip therein,
   wherein the enclosure is configured to fix a position of the qubit device with respect to the characterization probe chip during the characterization.

11. A system for non-invasively characterizing a qubit device, comprising:
   a characterization probe chip, comprising:
      a substrate;
      a characterization resonator formed on a first surface of the substrate, the characterization resonator comprising:
         a superconducting centerline;
         a pair of opposing superconducting ground planes formed on the first surface of the substrate, the pair of opposing superconducting ground planes formed on opposing sides of the superconducting centerline; and
         a superconducting antenna coupled to an end of the superconducting centerline, the superconducting antenna positioned to align with a qubit on the qubit device being characterized;
   wherein, in operation, the superconducting antenna is configured to capacitively couple the characterization resonator to the qubit aligned with the superconducting antenna for characterization of the qubit, and
   wherein, in operation, the superconducting centerline and the pair of opposing superconducting ground planes form a coplanar waveguide resonator.

12. The system for non-invasively characterizing a qubit device according to claim 11, further comprising:
   a control circuit configured to generate a characterization signal in the characterization resonator,
   wherein the control circuit is further configured to detect a resonance signal of the characterization resonator when the characterization signal is on resonance with the qubit.

13. The system for non-invasively characterizing a qubit device according to claim 12, further comprising a processor in communication with the control circuit,
   wherein the processor is configured to:
      receive an indication of the detected resonance signal from the control circuit, and
      calculate a frequency of the qubit aligned with the superconducting antenna based on the detected resonance signal.

14. The system for non-invasively characterizing a qubit device according to claim 11, wherein the qubit device comprises a first surface on which the qubit is formed, and a second surface opposing the first surface, and
   wherein the characterization probe chip is configured to be releasably fixed with respect to the qubit device such that the first surface of the substrate faces the first surface of the qubit device.

15. The system for non-invasively characterizing a qubit device according to claim 14, wherein the first surface of the substrate comprises a trench formed therein, and
   wherein the characterization resonator is formed in the trench.

16. The system for non-invasively characterizing a qubit device according to claim 14, further comprising an interposer chip, wherein the interposer chip is configured to be disposed between the qubit device and the characterization probe chip.

17. The system for non-invasively characterizing a qubit device according to claim 11, further comprising a temporary fixture configured to releasably fix a position of said characterization probe chip with respect to said qubit device during the characterization of the qubit.

18. The system for non-invasively characterizing a qubit device according to claim 11, further comprising:
   an enclosure configured to mount the characterization probe chip and the qubit device, comprising:
      a base substrate defining a first compartment configured to receive the qubit device therein; and
      a printed circuit board mechanically coupled to the base substrate, the printed circuit board defining a second compartment configured to receive the characterization probe chip therein,
   wherein the enclosure is configured to fix a position of the qubit device with respect to the characterization probe chip during the characterization.

19. A method of non-invasively characterizing a qubit device, comprising:
   bringing a characterization probe chip into proximity with the qubit device, the characterization probe chip having a characterization resonator comprising a superconducting stripline and a superconducting antenna coupled to an end of the superconducting stripline;
   positioning the characterization probe chip such that the superconducting antenna aligns with a qubit on the qubit device being characterized;
   capacitively coupling the characterization resonator to the qubit using the superconducting antenna; and
   characterizing the qubit using the capacitively coupled characterization resonator.

20. The method of non-invasively characterizing a qubit device according to claim 19, wherein the qubit device comprises a first surface on which the qubit is formed, and a second surface opposing the first surface, and
   wherein bringing the characterization probe chip into proximity with the qubit device comprises temporarily fixing the qubit device with respect to the characterization probe chip such that a surface of the characterization probe chip on which the characterization resonator is formed faces the first surface of the qubit device.

* * * * *